United States Patent [19]
Nguyen et al.

[11] Patent Number: 5,467,031
[45] Date of Patent: Nov. 14, 1995

[54] 3.3 VOLT CMOS TRI-STATE DRIVER CIRCUIT CAPABLE OF DRIVING COMMON 5 VOLT LINE

[75] Inventors: Trung Nguyen, San Jose; Hung Luong, Cupertino, both of Calif.

[73] Assignee: LSI Logic Corporation, Milpitas, Calif.

[21] Appl. No.: 310,941

[22] Filed: Sep. 22, 1994

[51] Int. Cl.$^6$ .............................................. H03K 19/0175
[52] U.S. Cl. ................................. 326/81; 326/27; 326/58; 327/534
[58] Field of Search ............................... 326/27, 58, 81, 326/121; 327/534, 537, 546

[56] References Cited

U.S. PATENT DOCUMENTS

| | | | |
|---|---|---|---|
| 4,782,250 | 11/1988 | Adams | 326/82 |
| 5,151,619 | 9/1992 | Austin et al. | 307/473 |
| 5,153,452 | 10/1992 | Iwamura et al. | 307/296.1 |
| 5,157,635 | 10/1992 | Ellis et al. | 365/230.06 |
| 5,160,855 | 11/1992 | Dobberpuhl | 307/270 |
| 5,184,031 | 2/1993 | Hayakawa et al. | 307/296.3 |
| 5,266,849 | 11/1993 | Kitahara | 326/81 |
| 5,338,978 | 8/1994 | Larsen | 307/443 |
| 5,381,056 | 1/1995 | Murphy | 326/21 |
| 5,381,061 | 1/1995 | Davis | 326/57 |
| 5,382,846 | 1/1995 | Shigehara | 326/68 |
| 5,396,128 | 3/1995 | Dunning | 326/68 |

OTHER PUBLICATIONS

Martin, Brian C.; *Tips for Straddling the 3–V to 5V Fence*; Electronic Design; Apr. 4, 1994, pp. 67–73.

*Primary Examiner*—Edward P. Westin
*Assistant Examiner*—Andrew Sanders
*Attorney, Agent, or Firm*—Poms, Smith, Lande & Rose

[57] ABSTRACT

A CMOS tri-state driver circuit is capable of operating in a normal drive mode and in a high impedance mode. The circuit is powered by a 3 volt power supply, and drives an output terminal that is common to a TTL or other device that can apply a 5 volt output to the output terminal. The circuit includes a PMOS pull-up transistor and an NMOS pull-down transistor that are connected to the output terminal. The pull-up transistor is formed in and has a substrate terminal that is connected to an N-well. A switching transistor is controlled to connect the N-well to the power supply in drive mode to ensure stable and strong pull-up drive. A pass-gate transistor is biased to turn off the switching transistor when the voltage at the output terminal is higher than the power supply voltage in high impedance mode, causing the N-well to float. This prevents leakage current from flowing through a semiconductor junction from the output terminal to the N-well through the pull-up transistor. A shorting transistor is controlled to short the gate of the pull-up transistor to the N-well when the voltage at the output terminal is higher than the power supply voltage in high impedance mode, thereby preventing leakage current from flowing through the channel of the pull-up transistor.

30 Claims, 4 Drawing Sheets

3.3 VOLT CMOS TRI-STATE DRIVER CIRCUIT CAPABLE OF DRIVING COMMON 5 VOLT LINE

BACKGROUND OF THE INVENTION

1. Field of the Invention

The present invention generally relates to the art of microelectronic integrated circuits, and more specifically to CMOS tri-state driver circuit that is powered by a relatively low supply voltage of, for example, 3.3 V, and is capable of driving a common output terminal that can receive external signals at a relatively higher voltage of, for example, 5 V.

2. Description of the Related Art

Continuous advancements in microelectronic integrated circuit fabrication technology enable the geometries of circuit devices to be progressively reduced so that more devices can fit on a single integrated circuit chip. However, certain types of devices are more susceptible to size reduction than other devices. Generally, the geometries of memory circuits are being reduced at a faster rate than are the geometries of logic circuits that are coupled to the memory circuits.

Transistor-Transistor-Logic (TTL) devices are conventionally powered from 5 volt power supplies. However, a problem is encountered in attempting to power memory circuits having smaller feature sizes from a 5 volt power supplies. This is because the upper limit of gate oxide field strength, for the case of silicon dioxide gates, is about 3 MV per centimeter. The maximum allowable voltage across a gate oxide layer of about 150 angstrom thickness is therefore approximately 4 V. If a 5 volt signal is applied to the gate of a small geometry CMOS memory device, the gate oxide can break down and the device can be destroyed.

For this reason, CMOS memory and other devices are being designed for operation with reduced voltage power supplies, a common voltage at the present state of the art being 3.3 V. However, low voltage CMOS memory devices must be operatively interconnected to TTL logic and other devices that operate at supply voltages of 5 V. Often, these devices must be connected to a common input/output line.

3.3 volt CMOS devices are capable of driving 5 volt TTL devices. Generally, such a CMOS device is provided with a tristate output driver circuit that is selectively operable in a normal drive mode, and also in a tristate or high impedance mode in which the driver circuit appears transparent to the line or output terminal to which it is connected.

If no precautions are taken, a 5 volt TTL level signal applied to a line to which a 3.3 volt tristate driver is connected can cause destruction of the driver due to the gate oxide breakdown effect discussed above. To prevent this, several expedients have been proposed in the prior art.

Figure 1:
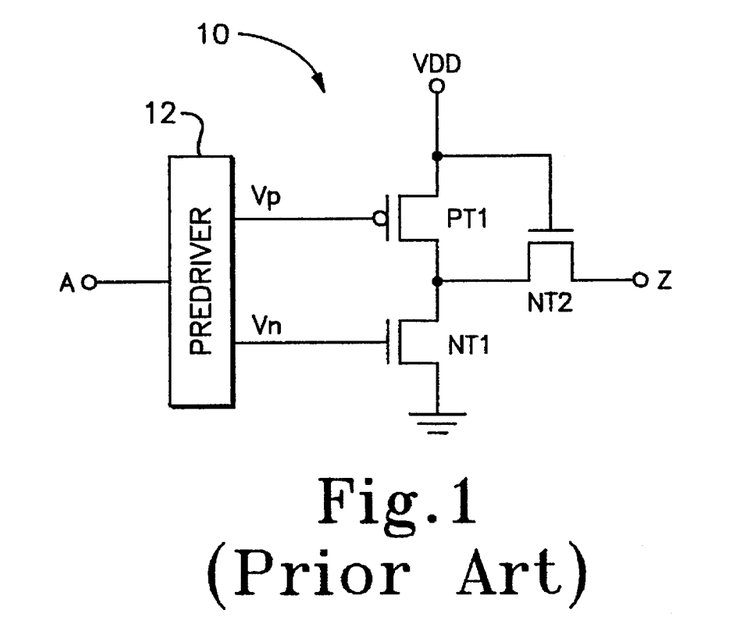
FIG. 1 is an electrical schematic diagram illustrating a prior art CMOS drive circuit.

A first example of a prior art 3.3 volt driver circuit that is capable of driving a line common to 5 volt TTL signals is illustrated in FIG. 1 and generally designated by the reference numeral 10.

The driver circuit 10 comprises a pre-driver 12, which receives an input signal A that can have either a logically high value (substantially equal to a power supply voltage VDD=3.3 V), or a logically low value (ground). The pre-driver 12 produces output signals $V_p$ and $V_n$ that are connected to the gates of a PMOS pull up transistor PT1 and an NMOS pull down transistor NT1, respectively. The drain of the transistor PT1 is connected to the drain of the transistor NT1. The source of the transistor PT1 is connected to the power supply voltage VDD, whereas the source of the transistor NT1 is connected to ground.

The common connection of the transistors PT1 and NT1 constitutes an output of the circuit 10, which is applied through a pass-gate consisting of an NMOS transistor NT2 to an output terminal Z. The gate of the transistor NT2 is connected to the supply voltage VDD.

In operation, if a logically high signal A is applied to the pre-driver 12, the signals $V_p$ and $V_n$ will both be logically low. The low signal applied to the gate of the PMOS transistor PT1 turns on the transistor PT1, thereby "pulling up" the junction of the transistors PT1 and NT1 to the supply voltage VDD. The low $V_n$ signal which is applied to the gate of the transistor NT1 turns off the transistor NT1.

Conversely, if the input signal A is low, the signals $V_p$ and $V_n$ will be high. The high $V_p$ signal turns off the transistor PT1. The high signal $V_n$ turns on the transistor NT1. The transistor NT1 "pulls down" the junction of the transistors PT1 and NT1 to ground.

The pass gate transistor NT2 is provided to connect the junction of the transistors PT1 and NT1 to the output Z, and also to protect the transistors PT1 and NT1 from damage which might otherwise result from application of a 5 volt signal from the output terminal Z to the junction of the transistors PT1 and NT1.

More specifically, the power supply voltage VDD=3.3 V is applied to the gate of the transistor NT2. Assuming that a 5 V signal is applied to the terminal Z, the voltage difference between the output terminal and the gate of the transistor NT2 is 5−3.3=1.7 V. If the voltage at the junction of the transistors PT1 and NT1 is zero, the voltage difference between the junction and the gate of the transistor NT2 is 3.3 V. These are the maximum voltage differences that can exist in the circuit 10, and are below the 4 volt limit above which destruction of the transistors PT1, NT1 and/or NT2 can occur.

Although accomplishing its function of protecting the transistors PT1 and NT1 from damage caused by application of 5 V to the output terminal Z, the pass-gate transistor NT2 undesirably limits the output voltage and drive power of the circuit.

Since 3.3 V is applied to the gate of the transistor NT2, the maximum output voltage that the circuit 10 can produce on the output terminal Z is 3.3 V minus the threshold voltage of the transistor NT2, which is typically 0.7 V. The maximum output voltage is therefore 3.3 V−0.7 V=2.6 V. This is only marginally higher than the minimum logically high output level of 2.45 V that is required by TTL logic devices.

If the power supply voltage VDD drops by 10% to 3 V, which is common in actual circuit applications, the output voltage will drop to 3 V−0.7 V=2.3 V, which is too low to drive a TTL logic gate. The drive power of the circuit 10 is correspondingly low.

Although this problem can be solved by applying a higher voltage, for example 4 V, to the gate of the transistor PT1, this is not desirable because an additional power supply would be required to produce this voltage.

Figure 2:
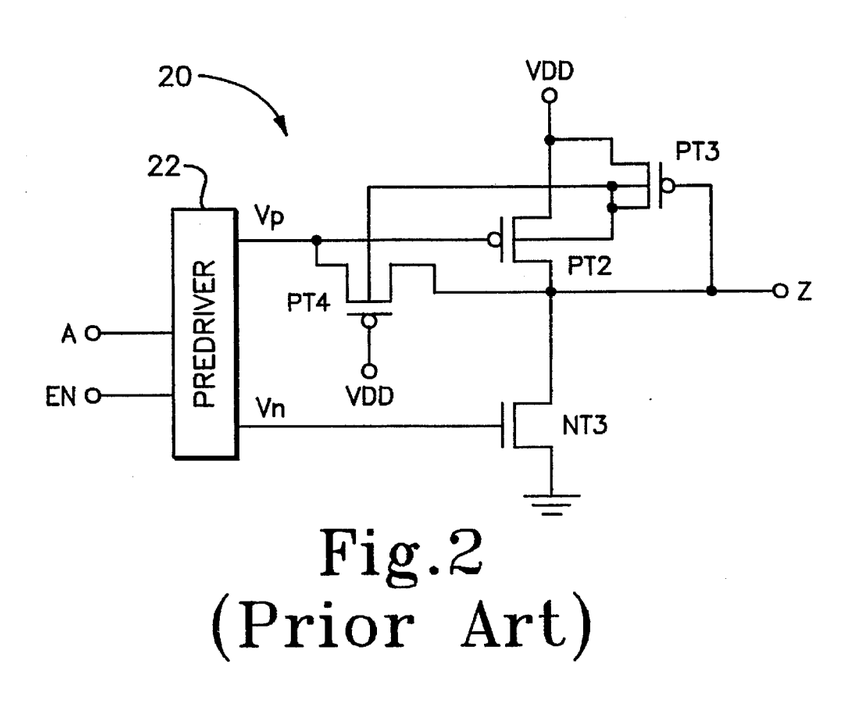
FIG. 2 is similar to FIG. 1, but illustrates another prior art drive circuit.

FIG. 2 illustrates another driver circuit 20 such as disclosed in U.S. Pat. No. 5,151,619, entitled "CMOS OFF CHIP DRIVER CIRCUIT", issued Sep. 29, 1992 to John Austin et al, that improves over the circuit of FIG. 1 by providing increased output voltage. The circuit 20 comprises a predriver 22 which is similar to the predriver 12 of FIG. 1, but is additionally provided with an enable input EN.

When the input EN is low, the circuit 20 operates in a normal drive mode as described above. When the input EN is high, the circuit 20 operates in a tri-state or high impedance mode, in which it presents an extremely high impedance to the output terminal Z and thereby appears transparent to an external device (not shown) connected to the terminal Z.

The predriver 22 produces output signals $V_p$ and $V_n$ that are connected to the gates of a PMOS pull-up transistor PT2 and an NMOS pull-down transistor NT3, respectively. The transistors PT2 and NT3 correspond to the transistors PT1 and NT1 of the circuit 10, and operate in the manner described above in response to high and low input signals A applied thereto in drive mode. However, due to the absence of a pass-gate, the circuit 20 is capable of providing a high logical output of VDD=3.3 V.

When the enable signal EN is high, the predriver 22 produces high and low signals $V_p$ and $V_n$ that turn off the transistors PT2 and NT3 respectively and produce the high impedance state.

If no precautions are taken and a voltage higher than 3.3 V (for example 5 V) is applied to the output terminal Z by an external TTL logic or other device (not shown), leakage current can flow through the channel of the transistor PT2.

This will occur when the voltage at the terminal Z (the drain of the transistor PT2) exceeds the voltage VDD at the source of the transistor PT2, or when the voltage at the terminal Z is higher than 3.3 V. Current leaks from the terminal Z through the channel of the transistor PT2 from the drain to the source thereof and flows into the source of the voltage VDD.

This undesired current flow is prevented by connecting a PMOS transistor PT4 between the gate and drain of the transistor PT2. The gate of the transistor PT4 is connected to VDD. Whenever the voltage at the terminal Z exceeds VDD plus the threshold voltage of the transistor PT4, or 3.3 V+0.7 V=4.0 V, the transistor PT4 turns on to connect or short the gate and drain of the transistor PT2 together and thereby turn off the transistor PT2.

This arrangement suffers from the drawback that leakage current will flow when the voltage at the terminal Z is between 3.3 V and 4.0 V.

As is conventional in the fabrication of CMOS integrated circuits, PMOS transistors are formed in N-wells (typically all of the PMOS transistors of the circuit 20 are formed in a common N-well) and have substrate terminals that are electrically integral with or connected to the N-well(s). This is not explicitly shown in the present drawings, but is described and illustrated in the above referenced patent to Austin et al.

Due to the N-well construction of the PMOS transistors, a parasitic PN semiconductor junction exists between the drain and N-well of the transistor PT2. If the voltage at the terminal Z exceeds the supply voltage VDD by more than the threshold voltage (typically 0.3 V) of the parasitic junction, leakage current can flow from the terminal Z through the junction into the N-well. With the N-well connected to VDD, this leakage current can flow when the voltage at the terminal Z exceeds 3.3+0.3=3.6 V.

Leakage current is prevented from flowing through the junction by connecting a PMOS switch transistor PT3 between the supply voltage VDD and the substrate terminal (N-well) of the pull-up transistor PT2. The gate of the transistor PT3 is connected to the output terminal Z. The substrate terminal of the transistor PT3 is connected to the substrate terminal (common N-well) of the transistor PT2.

Whenever the voltage at the terminal Z is below VDD minus the threshold voltage of the transistor PT3, or VDD−0.7 V=2.6 V, the transistor PT3 is turned on to connect the substrate terminal of the pull-up transistor PT2 to the supply voltage VDD.

When the voltage at the terminal Z exceeds 2.6 V, the transistor PT3 is turned off and the substrate terminal of the transistor PT2 is allowed to float.

The N-well of the transistors PT2 and PT3 will charge through the parasitic junction to the voltage at the terminal Z minus the threshold voltage of the junction. For a 5 V signal at the terminal Z, the N-well will charge to 5 V−0.3 V=4.7 V. Since the N-well is connected to the substrate terminal of the transistor PT2, this high voltage will turn off the transistor PT2 and prevent further current from flowing from the terminal Z into the N-well.

Another problem is inherent in the circuit 20, however, in that the transistor PT3 will disconnect the substrate terminal of the transistor PT2 from the supply voltage VDD, and allow the substrate terminal to float in drive mode whenever the voltage at the terminal Z exceeds 2.6 V. This causes the N-well to discharge from VDD to a lower voltage, and degrades the drive power and stability of the transistor PT2.

SUMMARY OF THE INVENTION

A CMOS tri-state driver circuit embodying the present invention is capable of operating in a normal drive mode and in a high impedance mode. The circuit is powered by a 3.3 volt power supply, and drives an output terminal that is common to a TTL or other device that can apply a 5 volt output to the terminal.

The circuit includes a PMOS pull-up transistor and an NMOS pull-down transistor that are connected to the output terminal. The pull-up transistor is formed in and has a substrate terminal that is connected to an N-well. A switching transistor is controlled to connect the N-well to the power supply in drive mode to ensure stable and strong pull-up drive.

A pass-gate transistor is biased to turn off the switching transistor when the voltage at the output terminal is higher than the power supply voltage in high impedance mode, causing the N-well to float. This prevents leakage current from flowing through a semiconductor junction from the output terminal to the N-well through the pull-up transistor.

A shorting transistor is controlled to short the gate of the pull-up transistor to the N-well when the voltage at the output terminal is higher than the power supply voltage in high impedance mode, thereby preventing leakage current from flowing through the channel of the pull-up transistor.

The present arrangement overcomes the drawbacks of the prior art by preventing the switch transistor from turning on and allowing the substrate terminal of the pull-up transistor to float when a relatively low voltage on the order of 2.6 V is applied to the output terminal, thereby degrading the drive power and stability of the pull-up transistor in drive mode. The present invention also prevents leakage current through the channel of the pull-up transistor when the voltage at the output terminal is between 3.3 V and 4 V as can occur in the prior art.

These unique features of the present invention provide a CMOS tri-state driver circuit that is substantially more stable, and provides higher drive power than comparable drive circuits that have been proposed heretofore.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 3:
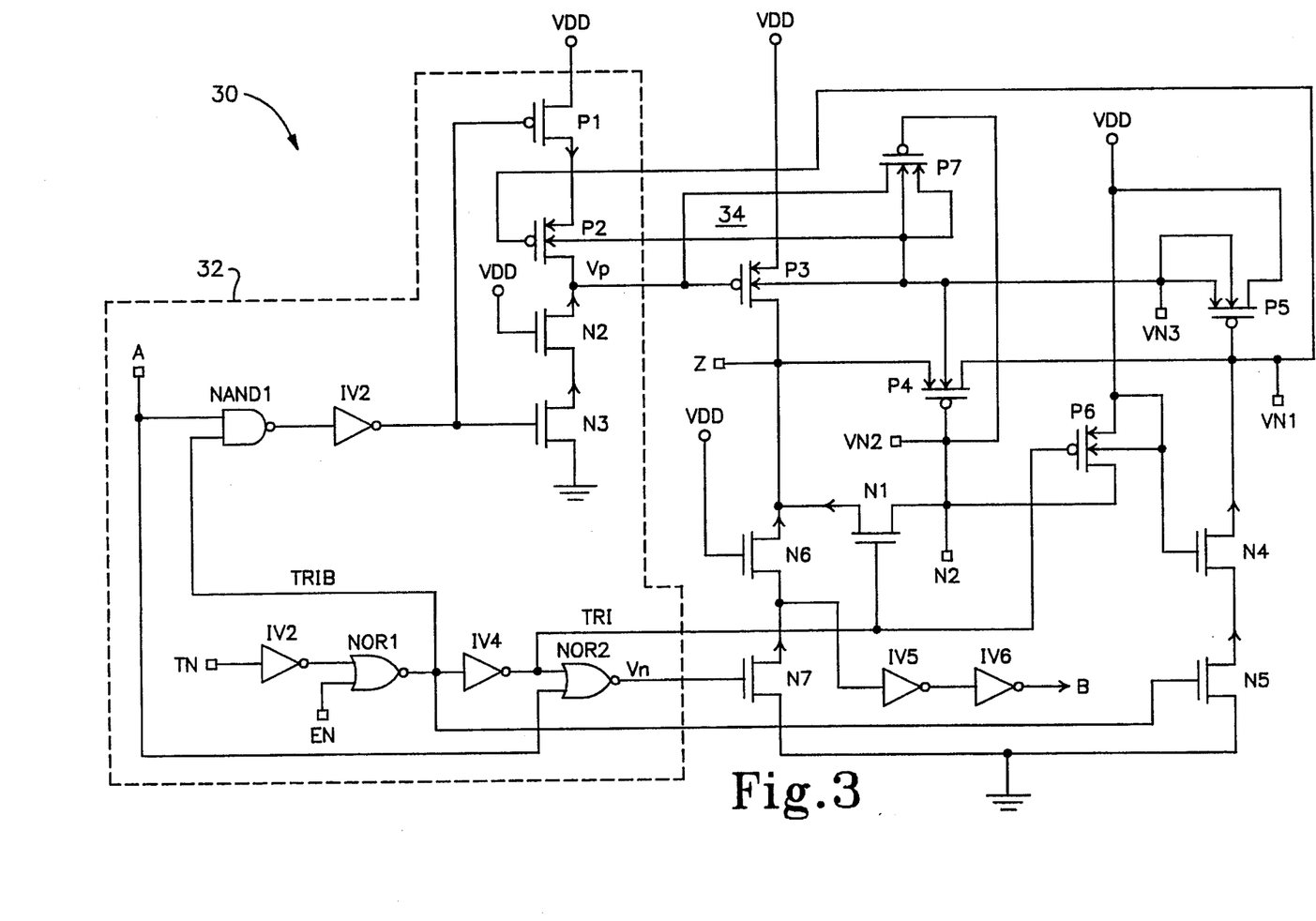
FIG. 3 is an electrical schematic diagram illustrating a CMOS tri-state drive circuit embodying the present invention.

A CMOS tristate driver circuit 30 embodying the present invention is illustrated in FIG. 3 and comprises a predriver 32 that includes the elements enclosed in broken line. An input signal A is applied to an input of a NAND gate NAND1, and also to an input of a NOR gate NOR2.

The output of the NAND gate NAND1 is connected through an inverter IV2 to the gates of a PMOS pull-up transistor P1 and an NMOS pull-down transistor N3. The source of the transistor P1 is connected to a power supply voltage VDD, whereas the source of the transistor N3 is connected to ground.

The drain of the transistor P1 is connected to the source of a PMOS transistor P2, the drain of which is connected to the drain of an NMOS transistor N2. The source of the transistor N2 is connected to the drain of the transistor N3. The gate of the transistor N2 is connected to the power supply voltage VDD.

A low logic enable signal TN is connected through an inverter IV2 to an input of a NOR gate NOR1. A high level enable signal EN is connected to another input of the NOR gate NOR1. The output of the NOR gate NOR1 is connected to another input of the NAND gate NAND1, and also through an inverter IV4 to another input of the NOR gate NOR2.

A tristate signal TRI appears at the output of the inverter IV4, whereas an inverted tristate signal TRIB appears at the output of the NOR gate NOR1.

The pre-driver 32 produces two output signals $V_p$ and $V_n$ which appear at the junction of the transistors P2 and N2, and at the output of the NOR gate NOR2 respectively. The signal $V_p$ is applied to the gate of a PMOS pull-up transistor P3, whereas the signal $V_n$ is applied to the gate of an NMOS pull-down transistor N7. The source of the transistor P3 is connected to the power supply voltage VDD, whereas the source of the transistor N7 is connected to ground.

The drain of the transistor P3 is connected to an output terminal Z, whereas the drain of the transistor N7 is connected to the source of an NMOS transistor N6. The drain of the transistor N6 is connected to the output terminal Z, whereas the gate of the transistor N6 is connected to the supply voltage VDD.

The PMOS transistors are formed in an N-well using conventional technology. The N-well is not explicitly illustrated in FIG. 3, but is symbolically indicated at 34. The PMOS transistors P2 and P3 have substrate terminals which are commonly connected to the N-well 34.

A PMOS switch transistor P5 is connected between the power supply voltage VDD and the substrate terminals of the transistors P2 and P3. The connection of the substrate terminals and the N-well is designated as a node N3. The substrate terminal of the transistor P5 is also connected to the node N3.

The gate of the transistor P5 is designated as a node VN1. A PMOS pass gate transistor P4 is connected between the output terminal Z and the node VN1. The substrate terminal of the transistor P4 is connected to the node VN3. The gate of the pass gate transistor P4 is designated as a node VN2.

An NMOS biasing transistor N1 is connected between the drain of the transistor N6 and the node VN2. The gate of the transistor N1 is connected to the output of the inverter IV4. A PMOS biasing transistor P6 is connected between the node VN2 and the power supply voltage VDD. The substrate terminal of the transistor P6 is connected to the source thereof.

The source of an NMOS control transistor N5 is connected to ground. The drain of the transistor N5 is connected to the source of an NMOS transistor N4, the drain of which is connected to the node VN1. The gate of the transistor N4 is connected to the power supply voltage VDD.

A PMOS shorting transistor P7 is connected between the node VN3 and the gate of the pull-up transistor P3. The substrate terminal of the transistor P7 is connected to the node VN3. The gate of the transistor P7 is connected to the node VN2.

The circuit 30 can also function as a bidirectional or input/output driver. This can be accomplished by providing input buffers such as inverters IV5 and IV6 that are connected to the terminal Z through the transistor N6 or other appropriate circuitry to provide an output signal B.

The circuit 30 is controlled to operate in the normal drive mode by making the enable signal EN low and the negative logic enable signal TN high. This will cause the tristate signal TRI to go low and the inverted tristate signal TRIB to go high.

The low TRI signal causes the NOR gate NOR2 to function as an inverter, whereas the high TRIB signal causes the NAND gate NAND1 to function as an inverter. If the input signal A is high, the signal at the gates of the transistors P1 and N3 will be high, thereby turning off the transistor P1 and turning on the transistor N3.

The signal $V_p$ at the junction of the transistors P2 and N2 will be low, thereby turning on the pull-up transistor P3 to connect the output terminal Z to the supply voltage VDD. The signal $V_n$ at the gate of the transistor N7 is also low, turning off the transistor N7. Thus, the voltage that appears at the output terminal Z is pulled up by the transistor P3 to VDD=3.3 V.

If the input signal A is low, the signal at the gates of the transistors P1 and N3 will be low, thereby turning on the transistor P1 and turning off the transistor N3. The signal $V_p$ at the junction of the transistors P2 and N2 will be high, thereby turning off the pull-up transistor P3. The signal $V_n$ at the gate of the transistor N7 is also high, turning on the transistor N7. Thus, the voltage that appears at the output terminal Z is pulled down by the transistor N7 to ground.

In drive mode, the low signal TRI turns off the transistor N1 and turns on the transistor P6, which connects the gate of the pass-gate transistor P4 (node VN2) to the supply voltage VDD. This causes the transistor P4 to be turned off.

The high signal TRIB is applied to the gate of the transistor N5, which turns on the transistor N5 to connect the gate of the switch transistor P5 to ground. This turns on the transistor P5 which connects the N-well (the substrate terminals of the transistors P3, P4, P5 and P7) to the supply voltage VDD.

In this manner, the substrate terminal of the pull-up transistor P3 is connected to the supply voltage VDD in drive mode, regardless of the voltage at the output terminal Z. This enables the transistor P3 to pull the terminal Z up to the supply voltage VDD=3.3 V, thereby providing a high logic output signal with strong and stable drive power.

For tristate or high impedance mode operation, the enable signal EN is made high and the negative logic enable signal TN is made low, thereby causing the tristate signal TRI to be high and the inverted tristate signal TRIB to be low. The low signal TRIB causes the NAND gate NAND1 to produce a high output, such that the signal $V_p$ is high and the signal $N_n$ is low. This causes the pull-up and pull-down transistors P3 and N7 respectively to be turned off and appear transparent to an external device connected to the terminal Z.

The low TRIB signal turns off the transistor N6 to disconnect the gate of the switch transistor P5 (node VN1) from ground. The high TRI signal turns off the transistor P6 to disconnect the gate of the pass-gate transistor P4 (node VN2) from the supply voltage VDD.

The TRI signal that is applied to the gate of the transistor N1 is substantially equal to VDD=3.3 V. The voltage at the node VN2, and thereby at the gate of the pass-gate transistor P4, is therefore limited to the 3.3 V minus the threshold voltage of the transistor N1, or 2.6 V.

When a voltage applied to the output terminal Z from an external device (not shown) exceeds 2.6 V plus the threshold voltage of the transistor P4, or 3.3 V, the transistor P4 is turned on to connect the terminal Z to the gate of the switch transistor P5. The node VN1 therefore follows the voltage at the terminal Z. The transistor P5 is turned off by the high voltage at the node VN1, and disconnects the substrate terminals of the transistors P3, P4, P5 and P7 (N-well) from the supply voltage VDD.

This causes the substrate terminals of the PMOS transistors to float, and enables the N-well to which the substrate terminals are connected to charge through the parasitic PN semiconductor junction of the transistor P3 to the voltage at the terminal Z minus the threshold voltage of the junction. For a 5 V signal applied to the terminal, the N-well will charge to 5 V−0.3 V=4.7 V.

Leakage current through the N-well is eliminated in accordance with the present invention since the switch transistor P5 is turned off by the pass-gate transistor P4 at a terminal voltage of 3.3 V, which is below the leakage threshold of 3.6 V. This is accomplished by the present pass-gate transistor P4 in combination with the biasing transistor N1 that limits the voltage at the node VN2 to 2.6 V.

The transistor P2 is also controlled by the voltage at the node VN1, and is turned off when the transistor P4 is turned on to apply the high voltage (above 3.3 V) at the terminal Z to the node VN1. This positively disconnects the gate of the transistor P3 from the supply voltage VDD to eliminate the possibility of leakage current.

The shorting transistor P7 is controlled by the voltage at the node VN2, which is limited to 2.6 V. As described above, the N-well charges through the parasitic PN junction of the transistor P3 when the N-well is allowed to float. If the transistor P7 was not provided, the transistor P3 could conduct leakage current when the voltage at the terminal Z exceeded the supply voltage VDD at 3.3 V.

However, the transistor P7 will conduct when the N-well voltage exceeds 2.6 V plus the threshold voltage of the transistor P7, or at 3.3 V. This turns on the transistor P7 to short the gate of the transistor P3 to the substrate terminal (N-well), thereby positively turning off the transistor P3 and preventing leakage current therethrough.

It will be noted that the transistor PT4 of the prior art circuit 20 illustrated in FIG. 2 provides a function that is comparable to that of the present transistor P7. However, in the circuit 20, the transistor PT4 turns on at 4.0 V. Thus, the pull-up transistor PT2 of the prior art is subject to leakage current when the voltage at the output terminal is between 3.3 V and 4.0 V. This is prevented in accordance with the present invention.

The transistors N2, N4 and N6 are provided to protect the transistors N3, N5 and N7 respectively from damage that could be caused by application of a 5 V signal to the terminal Z. The supply voltage VDD=3.3 V is applied to the gates of the transistors N2, N4 and N6. The voltage differences between the sources, gates and drains of the transistors N2 to N7 are limited to values below the 4 volt limit above which destruction of the transistors can occur in the manner described above with reference to FIG. 1.

Figure 4:
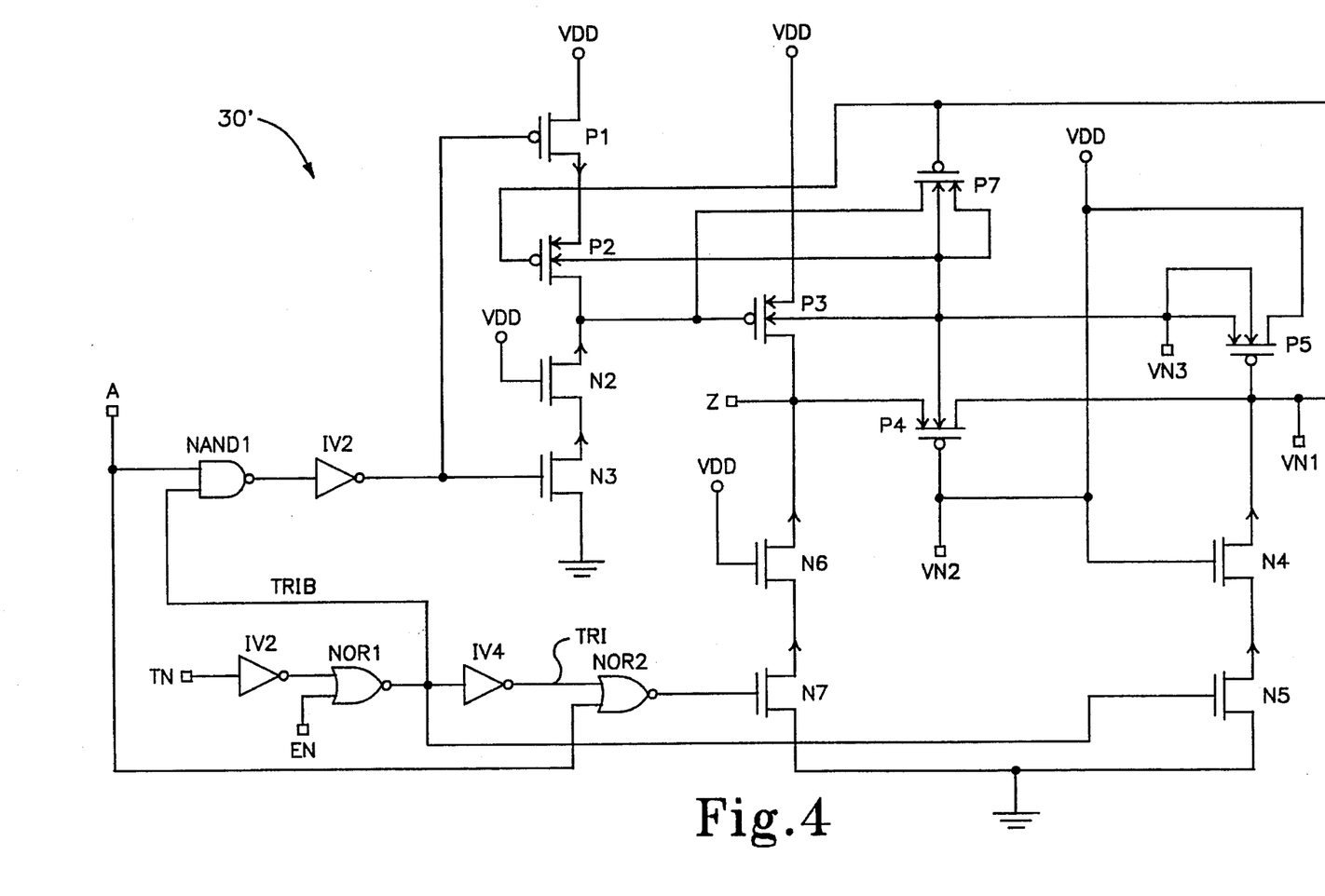
FIGS. 4 and 5 are electrical schematic diagrams illustrating alternative embodiments of the present drive circuit.
Figure 5:
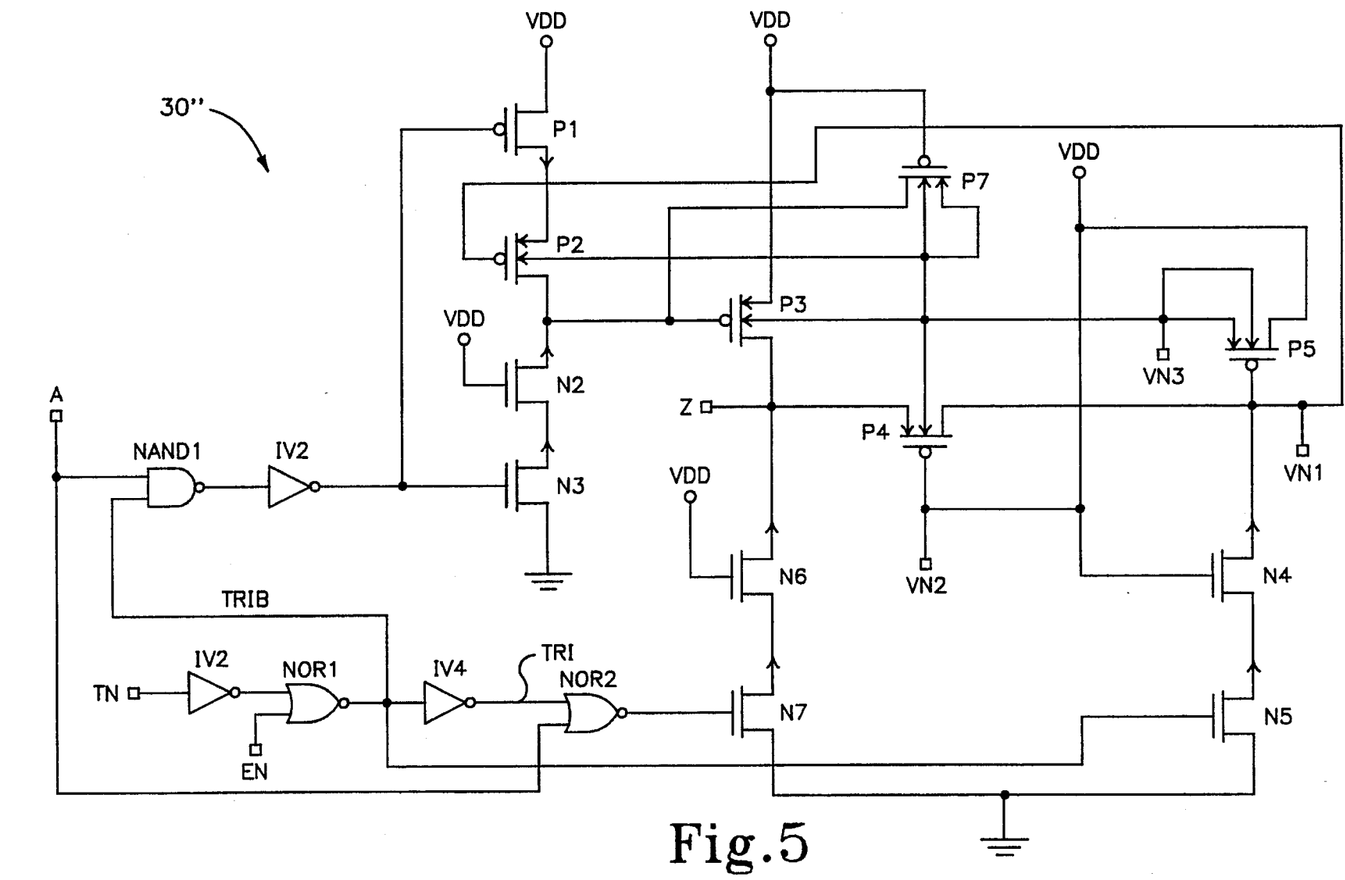

FIGS. 4 and 5 illustrate alternative embodiments of the circuit 30 of FIG. 3. A CMOS tristate driver circuit 30' illustrated in FIG. 4 differs from the circuit 30 in that the transistors N1, P4 and P6 are omitted, and the node VN2 is connected to the supply voltage VDD. The transistor P5 will be turned off when the voltage at the terminal Z exceeds 4 V. In addition, the gate of the transistor P7 is connected to the node VN1 rather than to the node VN2.

FIG. 5 illustrates a circuit 30" that differs from the circuit 30' in that the gate of the transistor P7 is connected to the supply voltage VDD.

The present arrangement overcomes the drawbacks of the prior art by preventing the switch transistor P5 from turning on and allowing the substrate terminal of the pull-up transistor P4 to float when a relatively low voltage of 2.6 V is applied to the output terminal, thereby degrading the drive power and stability of the pull-up transistor in drive mode. The present invention also prevents leakage current through the channel of the pull-up transistor when the voltage at the output terminal is between 3.3 V and 4 V as can occur in the prior art.

These unique features of the present invention provide a CMOS tri-state driver circuit that is substantially more stable, and provides higher drive power than comparable drive circuits that have been proposed heretofore.

Various modifications will become possible for those skilled in the art after receiving the teachings of the present disclosure without departing from the scope thereof.

We claim:

1. A driver circuit that is powered by a supply voltage and drives an output terminal in a drive mode, the output terminal being connected to receive an external voltage that can be higher than said supply voltage in a high impedance mode, comprising:

a pull-up transistor that is connected between said supply voltage and the output terminal and includes a substrate terminal;

a switch transistor that is connected between the substrate terminal and said supply voltage; and a pass-gate transistor that is connected between the output terminal and the switch transistor and is biased to turn off the switch transistor when said external voltage is higher than substantially said supply voltage in said high impedance mode.

2. A circuit as in claim 1, in which:

the switch transistor is a field-effect transistor that includes a gate; and the pass-gate transistor is connected between the output terminal and the gate of the switch transistor.

3. A circuit as in claim 1, further comprising circuitry for turning on the switch transistor in said drive mode.

4. A circuit as in claim 1, in which:

the pull-up transistor is a field-effect transistor having a semiconductor junction that will pass leakage current if the substrate terminal is at said supply voltage and said external voltage is higher than substantially a first predetermined value that is equal to said supply voltage plus a threshold voltage of said semiconductor junction; and the circuit further comprises biasing circuitry for biasing the pass-gate transistor to turn off the switch transistor when said external voltage is higher than a second predetermined value that is lower than said first predetermined value.

5. A circuit as in claim 4, in which:

the pass-gate transistor is a field-effect transistor that includes a gate and has a threshold voltage; and the biasing circuitry applies a bias voltage to the gate of the pass-gate transistor that is limited to substantially a third predetermined value which is equal to said supply voltage minus said threshold voltage of the pass-gate transistor in said high impedance mode.

6. A circuit as in claim 5, in which the biasing circuitry applies a bias voltage to the gate of the pass-gate transistor that turns off the pass-gate transistor in said drive mode.

7. A circuit as in claim 5, in which:

the biasing circuitry comprises a biasing transistor that is connected between the output terminal and the gate of the pass-gate transistor, includes a gate, and has a threshold voltage that is substantially equal to said threshold voltage of the pass-gate transistor; and the circuit comprises circuitry for turning off the biasing transistor in said drive mode and applying substantially said supply voltage to the gate of the biasing transistor in said high impedance mode.

8. A circuit as in claim 5, in which:

the pull-up transistor is a field-effect transistor that includes a gate; and the circuit further comprises a field-effect shorting transistor that is connected between the gate of the pull-up transistor and the substrate terminal and includes a gate which is connected to the gate of the pass-gate transistor.

9. A circuit as in claim 8, in which the pull-up transistor, the pass-gate transistor and the shorting transistor are PMOS field-effect transistors.

10. A circuit as in claim 9, further comprising an NMOS field-effect pull-down transistor that is operatively connected to the output terminal.

11. A circuit as in claim 1, in which:

the pull-up transistor is a field-effect transistor that includes a gate and has a semiconductor junction that can pass leakage current from the output terminal to the substrate terminal; and the circuit further comprises a shorting transistor that is connected between the gate of the pull-up transistor and the substrate terminal and is biased to turn on when a voltage at the substrate terminal exceeds substantially said supply voltage.

12. A circuit as in claim 11, in which:

the pass-gate transistor is a field-effect transistor that includes a gate; and the shorting transistor is a field-effect transistor that includes a gate which is connected to the gate of the pass-gate transistor.

13. A circuit as in claim 11, in which:

the switch transistor is a field-effect transistor that includes a gate; and the shorting transistor is a field-effect transistor that includes a gate which is connected to the gate of the switch transistor.

14. A circuit as in claim 11, in which the shorting transistor is a field-effect transistor that includes a gate which is connected to said supply voltage.

15. A CMOS driver circuit that is powered by a supply voltage and drives an output terminal in a drive mode, the output terminal being connected to receive an external voltage that can be higher than said supply voltage in a high impedance mode, comprising:

a PMOS pull-up transistor that is connected between said supply voltage and the output terminal and includes a substrate terminal;

a PMOS switch transistor that is connected between the substrate terminal and said supply voltage; and a PMOS pass-gate transistor that is connected between the output terminal and the switch transistor and is biased to turn off the switch transistor when said external voltage is higher than substantially said supply voltage in said high impedance mode.

16. A circuit as in claim 15, in which the pass-gate transistor is connected between the output terminal and a gate of the switch transistor.

17. A circuit as in claim 15, further comprising circuitry for turning on the switch transistor in said drive mode.

18. A circuit as in claim 15, in which:

the pull-up transistor has a semiconductor junction that will pass leakage current if the substrate terminal is at said supply voltage and said external voltage is higher than substantially a first predetermined value that is equal to said supply voltage plus a threshold voltage of said semiconductor junction; and the circuit further comprises biasing circuitry for biasing the pass-gate transistor to turn off the switch transistor when said external voltage is higher than a second predetermined value which is lower than said first predetermined value.

19. A circuit as in claim 18, in which the biasing circuitry applies a bias voltage to a gate of the pass-gate transistor that is limited to substantially a third predetermined value which is equal to said supply voltage minus a threshold voltage of the pass-gate transistor in said high impedance mode.

20. A circuit as in claim 19, in which the biasing circuitry applies a bias voltage to the gate of the pass-gate transistor that turns off the pass-gate transistor in said drive mode.

21. A circuit as in claim 19, in which:

the biasing circuitry comprises an NMOS biasing transistor that is connected between the output terminal and the gate of the pass-gate transistor and has a threshold voltage that is substantially equal to said threshold voltage of the pass-gate transistor; and the circuit comprises circuitry for turning off the biasing transistor in said drive mode and applying substantially said supply voltage to a gate of the biasing transistor in said high impedance mode.

22. A circuit as in claim 19, in which the circuit further comprises a PMOS shorting transistor that is connected between the gate of the pull-up transistor and the substrate terminal and has a gate which is connected to the gate of the pass-gate transistor.

23. A circuit as in claim 22, further comprising an NMOS field-effect pull-down transistor that is operatively connected to the output terminal.

24. A circuit as in claim 15, in which:

the pull-up transistor has a semiconductor junction that can pass leakage current from the output terminal to the substrate terminal; and the circuit further comprises a PMOS shorting transistor that is connected between the gate of the pull-up transistor and the substrate terminal and is biased to turn on when a voltage at the substrate terminal exceeds substantially said supply voltage.

25. A circuit as in claim 24, in which the shorting transistor has a gate that is connected to the gate of the pass-gate transistor.

26. A circuit as in claim 24, in which the shorting transistor has a gate that is connected to the gate of the switch transistor.

27. A circuit as in claim 24, in which the shorting transistor has a gate that is connected to said supply voltage.

28. A circuit as in claim 15, in which the pass-gate transistor has a substrate terminal that is connected to the substrate terminal of the pull-up transistor.

29. A circuit as in claim 15, in which:

the circuit comprises an N-well in which the pull-up transistor is formed; and the substrate terminal is connected to the N-well.

30. A circuit as in claim 29, in which:

the pass-gate transistor is formed in and has a substrate terminal that is connected to the N-well;

the pull-up transistor has a semiconductor junction that can pass leakage current from the output terminal to the substrate terminal;

the circuit further comprises a PMOS shorting transistor that is connected between the gate of the pull-up transistor and the N-well and is biased to turn on when a voltage at the N-well is higher than substantially said supply voltage; and the shorting transistor is formed in and has a substrate terminal that is connected to the N-well.

* * * * *